(12) United States Patent
Takahashi et al.

(10) Patent No.: US 11,171,009 B2
(45) Date of Patent: Nov. 9, 2021

(54) PROCESSING METHOD OF WAFER (71) Applicant: DISCO CORPORATION, Tokyo (JP)

(72) Inventors: Hiroyuki Takahashi, Tokyo (JP);
Kentaro Wada, Tokyo (JP); Yoshio Watanabe, Tokyo (JP); Susumu Yokoo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/930,597

(22) Filed: Jul. 16, 2020

(65) Prior Publication Data

US 2021/0028022 A1 Jan. 28, 2021

(30) Foreign Application Priority Data

Jul. 23, 2019 (JP) .............................. JP2019-135257

(51) Int. Cl.
*H01L 21/3065* (2006.01)
*H01L 21/683* (2006.01)
(52) U.S. Cl.
CPC ...... *H01L 21/3065* (2013.01); *H01L 21/6831* (2013.01); *H01L 21/6836* (2013.01)
(58) Field of Classification Search
CPC ............. H01L 21/3065; H01L 21/6831; H01L 21/6836; H01L 21/68735
See application file for complete search history.

(56) References Cited

U.S. PATENT DOCUMENTS

| 2016/0064198 A1 | 3/2016 | Okita et al. |
| 2017/0006951 A1 | 3/2017 | Cucci et al. |
| 2017/0069518 A1 | 3/2017 | Cucci et al. |
| 2018/0151435 A1* | 5/2018 | Chiang ............... H01L 21/78 |
| 2018/0190542 A1 | 7/2018 | Martinez et al. |
| 2019/0221479 A1* | 7/2019 | Okita .................. H01L 21/78 |

FOREIGN PATENT DOCUMENTS

| CN | 105789013 A | 7/2016 |
| JP | 2018156973 A | 10/2018 |

OTHER PUBLICATIONS

Singapore App. 10202005943X: Search Report and Written Opinion (translation) dated May 25, 2021 (3 pages).

* cited by examiner

*Primary Examiner* — Binh X Tran (74) *Attorney, Agent, or Firm* — Greer, Burns & Crain, Ltd.

(57) ABSTRACT

There is provided a processing method of a wafer. The processing method includes a frame unit preparation step of fixing the wafer in an opening of an annular frame by an adhesion tape to prepare a frame unit and a frame unit holding step of attracting and holding the wafer of the frame unit by an chuck table in an etching chamber with the intermediary of the adhesion tape. The processing method includes also a shielding step of covering the annular frame and (or) an annular region of the adhesion tape by a cover member to shield the annular frame and (or) the annular region from an external space and a dry etching step of supplying a gas to the etching chamber and executing dry etching for the wafer after execution of the frame unit holding step and the shielding step.

14 Claims, 6 Drawing Sheets

PROCESSING METHOD OF WAFER

BACKGROUND OF THE INVENTION

Field of the Invention

The present invention relates to a processing method of a wafer.

Description of the Related Art

Techniques are known in which dry etching is executed for a device wafer in which devices are formed on a semiconductor substrate typified by a silicon substrate (for example, refer to Japanese Patent Laid-Open No. 2018-156973). As a mode of the dry etching, there is etching by a gas in a plasma state, for example. This technique is used also for purposes of forming dividing grooves to divide a wafer along planned dividing lines (streets) and improving a flexural strength by removing debris and a heat-affected layer (damaged layer) generated in laser processing. In the case of such processing, possibly the wafer is broken in the processing or in conveyance. Therefore, the wafer is processed in the form of a frame unit in which the wafer is fixed in an opening of an annular frame by an adhesion tape such as a dicing tape.

SUMMARY OF THE INVENTION

However, when a gas in a plasma state is supplied to the wafer in the form of the frame unit, possibly the adhesion tape and the annular frame at a periphery of the wafer are also processed by the plasma etching. For example, if the annular frame is made of a resin, possibly discoloration and dust generation occur due to the plasma etching. Furthermore, fluorine (F) is readily left in the adhesion layer of the adhesion tape as a residual. Therefore, when the wafer is left as it is in the air or a sealed container after the plasma etching processing, possibly hydrogen (H) in the air and the fluorine (F) form hydrogen fluoride (HF) to corrode electrodes of the devices.

Thus, an object of the present invention is to provide a processing method of a wafer by which processing of an adhesion tape and an annular frame at a periphery of a wafer due to dry etching is suppressed.

In accordance with an aspect of the present invention, there is provided a processing method of a wafer. The processing method includes a frame unit preparation step of fixing the wafer in an opening of an annular frame by an adhesion tape to prepare a frame unit and a frame unit holding step of attracting and holding the wafer of the frame unit by a chuck table in an etching chamber with intermediary of the adhesion tape. The processing method includes also a shielding step of covering the annular frame and/or an annular region of the adhesion tape exposed between the annular frame and the wafer by a cover member to shield the annular frame and/or the annular region from an external space and a dry etching step of supplying a gas to the etching chamber and executing dry etching for the wafer after execution of the frame unit holding step and the shielding step.

In the above-described processing method of a wafer, the annular frame may be formed of a resin and the annular frame may be covered by the cover member in the shielding step.

In the above-described processing method of a wafer, plasma etching in which a gas in a plasma state is supplied may be executed for the wafer in the dry etching step.

According to the aspect of the present invention, processing of the adhesion tape and the annular frame at the periphery of the wafer due to the dry etching is suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A mode (embodiment) for carrying out the present invention will be described in detail with reference to the drawings. The present invention is not limited by contents described in the following embodiment. Furthermore, what can easily be envisaged by those skilled in the art and what are substantially the same are included in constituent elements described below. Moreover, configurations described below can be combined as appropriate. In addition, various kinds of omission, replacement, or change can be executed without departing from the gist of the present invention.

Embodiment

Figure 1:
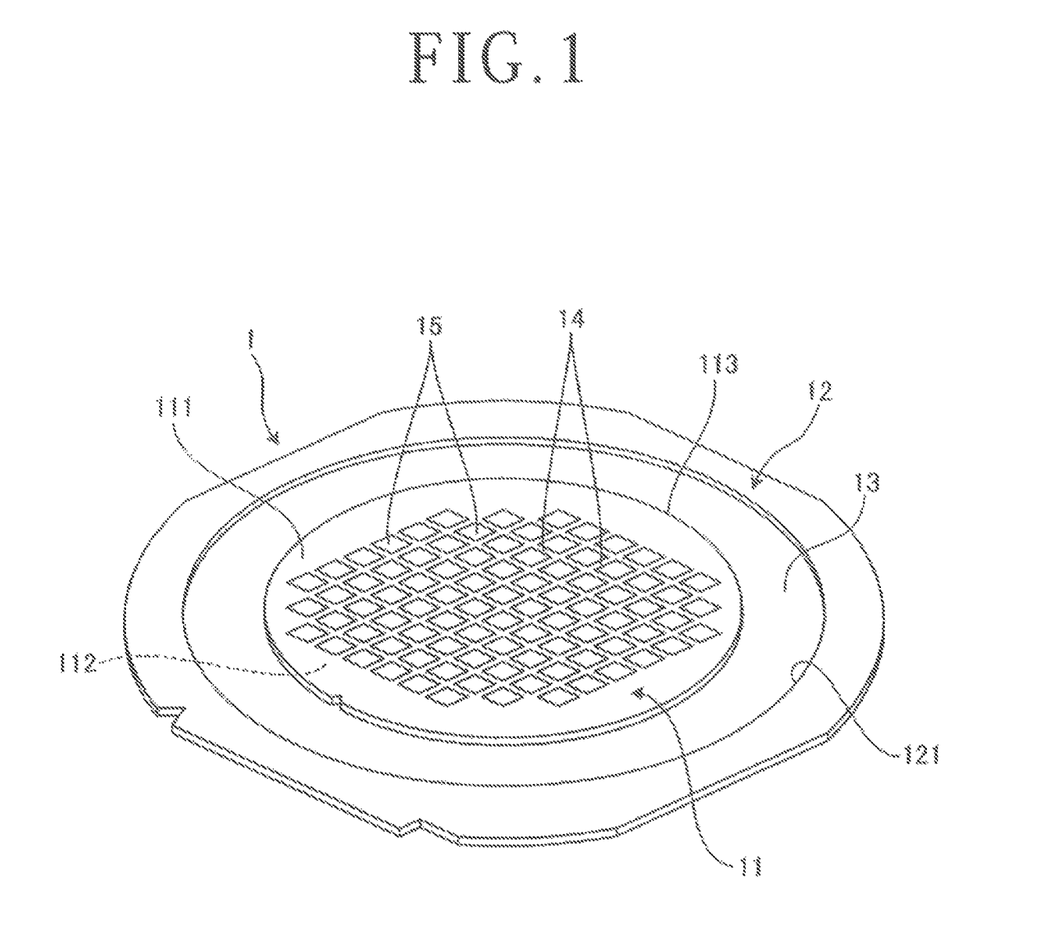
FIG. 1 is a perspective view depicting one example of a frame unit according to an embodiment.
Figure 2:
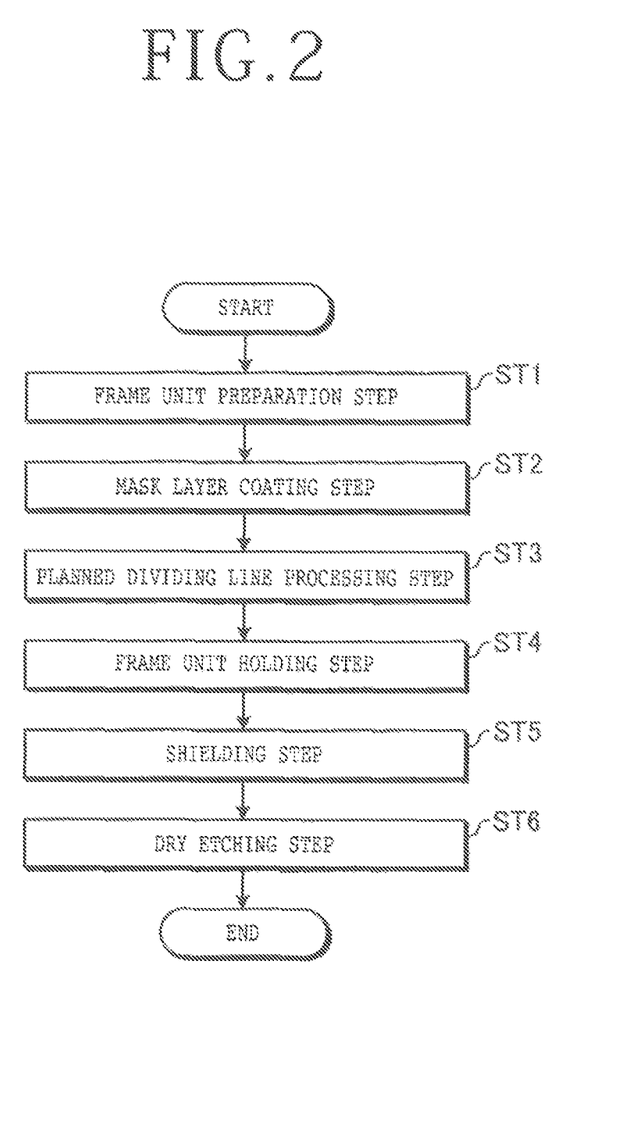
FIG. 2 is a flowchart depicting a flow of a processing method of a wafer according to the embodiment.

A processing method of a wafer according to the embodiment of the present invention will be described based on the drawings. FIG. 1 is a perspective view depicting one example of a frame unit according to the embodiment. FIG. 2 is a flowchart depicting a flow of the processing method of a wafer according to the embodiment.

As depicted in FIG. 1, a frame unit 1 includes a wafer 11, an annular frame 12, and an adhesion tape 13.

The wafer 11 is formed into a circular disc shape with a material such as silicon (Si), silicon carbide (SiC), or sapphire ($Al_2O_3$), for example. A front surface 111 of the wafer 11 is segmented into plural regions by planned dividing lines 14 (streets) set in a lattice manner. In each region, a device 15 such as an integrated circuit (IC) or light emitting diode (LED) is disposed.

The adhesion tape 13 with a larger diameter than the wafer 11 is stuck to a back surface 112 of the wafer 11. The adhesion tape 13 is referred to also as a resin sheet. The adhesion tape 13 has a circular disc shape. The adhesion tape 13 includes a base layer composed of an insulating synthesis resin and glue layers that are stacked on the front surface and back surface of the base layer and have adhesiveness. An inner circumferential edge 121 of the annular frame 12 is located on the outer circumferential side relative to an outer circumferential edge 113 of the wafer 11. That is, the outer diameter of the wafer 11 is smaller than the inner diameter of the annular frame 12. The inside of the inner circumferential edge 121 of the annular frame 12 is opened. Therefore, the annular frame 12 is disposed on the outer circumferential side of the wafer 11. The back surface of the annular frame 12 is stuck to the front surface of the outer circumferential part of the adhesion tape 13. That is, the wafer 11 is fixed in the opening of the annular frame 12 through the adhesion tape 13 and thereby the frame unit 1 in which the wafer 11 is fixed in the opening of the annular frame 12 by the adhesion tape 13 is configured. As the annular frame 12, what is composed of a material that has resistance against a gas 45 (depicted in FIG. 9) in a plasma state and is difficult to etch by the gas 45 in the plasma state can be applied. In the embodiment, the annular frame 12 is composed of a resin.

As depicted in FIG. 2, the processing method of a wafer according to the embodiment includes a frame unit preparation step (ST1), a mask layer coating step (ST2), a planned dividing line processing step (ST3), a frame unit holding step (ST4), a shielding step (ST5), and a dry etching step (ST6).

A step of preparing the frame unit 1 in which the wafer 11 is fixed in the opening of the annular frame 12 by the adhesion tape 13 as described above is the frame unit preparation step ST1. In the following, description will be made for each step regarding the mask layer coating step ST2 and subsequent steps.

(Mask Layer Coating Step ST2)

Figure 3:
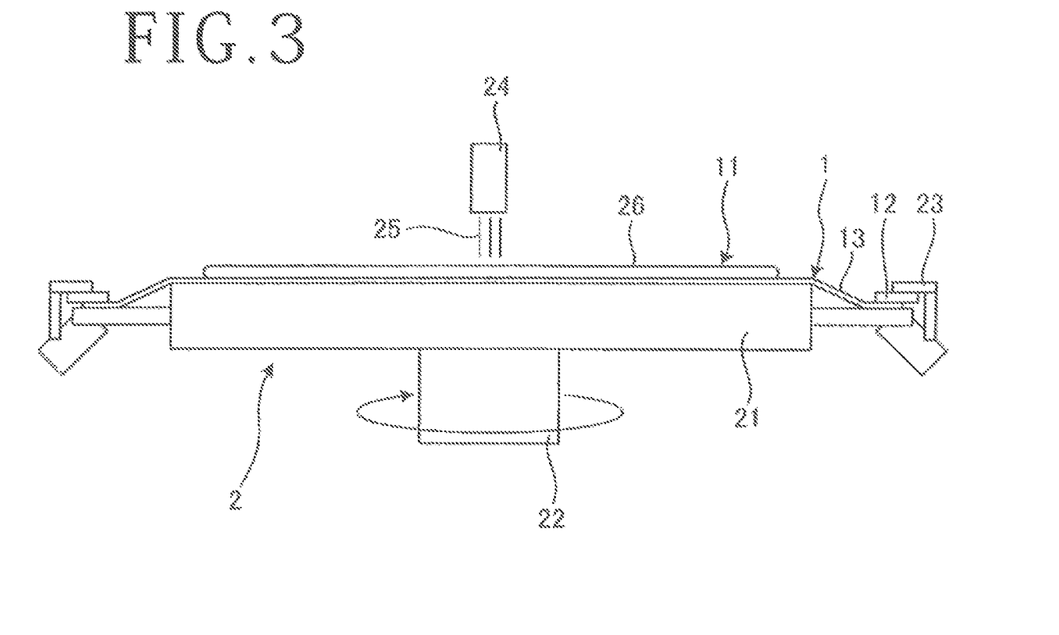
FIG. 3 is a side view depicting a state of a mask layer coating step of coating the wafer in the processing method of the wafer according to the embodiment with a mask layer.

The mask layer coating step ST2 is a step of coating the front surface 111 of the wafer 11 with a mask layer 26. FIG. 3 is a side view depicting a state of the mask layer coating step of coating the wafer in the processing method of the wafer according to the embodiment with the mask layer. The coating with the mask layer 26 is executed by using a spin coater 2. The mask layer 26 is referred to also as a coating layer. The spin coater 2 includes a spinner table (holding table) 21, a rotation axis part 22, a clamp apparatus 23, and a nozzle 24.

In the mask layer coating step ST2, by operation of a rotational drive source of the spin coater 2, the spinner table 21 that sucks and holds the wafer 11 rotates around the rotation axis part 22 and simultaneously rotates the frame unit 1. In the mask layer coating step ST2, as depicted in FIG. 3, the spin coater 2 applies a liquid resin 25 on the front surface 111 of the wafer 11 by dropping the liquid resin 25 from the nozzle 24 and rotating the spinner table 21. Thereafter, the liquid resin 25 is dried and cured and so forth and thereby the mask layer 26 is formed on the front surface 111 of the wafer 11.

The liquid resin 25 is a water-soluble liquid resin such as polyvinyl alcohol (PVA) or polyvinyl pyrrolidone (PVP) and is composed of a resin that has resistance against the gas 45 (depicted in FIG. 5 and FIG. 9) in the plasma state used in plasma etching when being cured and is difficult to etch by the gas 45 in the plasma state.

(Planned Dividing Line Processing Step ST3)

Figure 4:
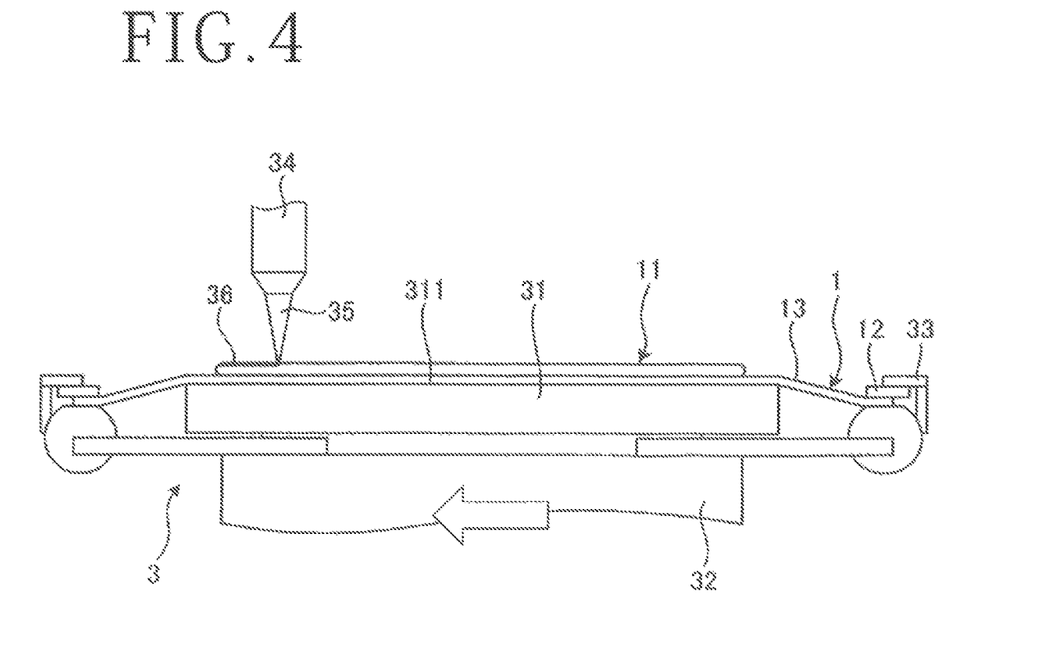
FIG. 4 is a side view depicting a state of a planned dividing line processing step of forming processed grooves in the mask layer on the wafer in the processing method of the wafer according to the embodiment.

The planned dividing line processing step ST3 is a step of forming processed grooves in the mask layer 26 on the planned dividing lines of the wafer 11. FIG. 4 is a side view depicting a state of the planned dividing line processing step of processing the mask layer on the wafer in the processing method of the wafer according to the embodiment to form the processed grooves. Along the planned dividing lines 14, processed grooves 36 resulting from processing the front surface 111 of the wafer 11 are formed. The planned dividing line processing step ST3 is executed by using a laser processing apparatus 3 depicted in FIG. 4, for example.

In the embodiment, in the planned dividing line processing step ST3, the back surface side of the wafer 11 is sucked and held over a holding surface 311 of a chuck table 31 in the laser processing apparatus 3 with the intermediary of the adhesion tape 13 and the annular frame 12 is clamped by a clamp apparatus 33. Then, as depicted in FIG. 4, the laser processing apparatus 3 forms the processed groove 36 in the wafer 11 and the mask layer 26 by irradiating the mask layer 26 with a laser beam 35 with such a wavelength as to be absorbed by the wafer 11 from a laser irradiation unit 34 while relatively moving the laser irradiation unit 34 and the chuck table 31 along the planned dividing line 14 (see FIG. 1).

(Frame Unit Holding Step ST4 and Shielding Step ST5)

Figure 5:
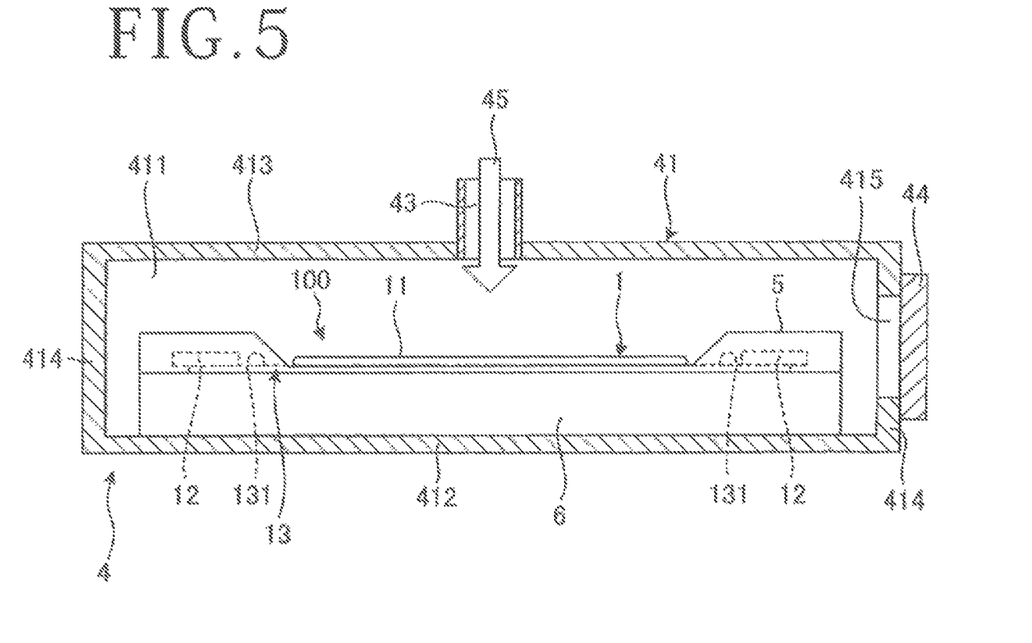
FIG. 5 is a sectional view depicting a plasma etching apparatus used in a dry etching step of executing plasma etching for the wafer in the processing method of the wafer according to the embodiment.
Figure 6:
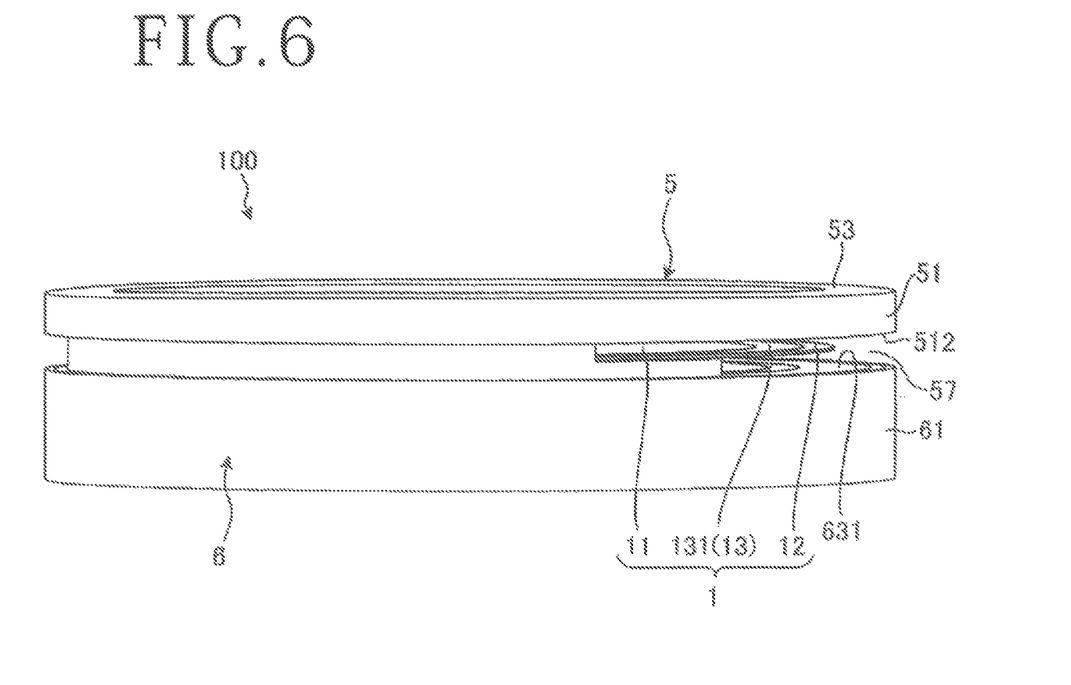
FIG. 6 is a perspective view of an electrostatic chuck table and a cover member in an etching chamber depicted in FIG. 5.
Figure 7:
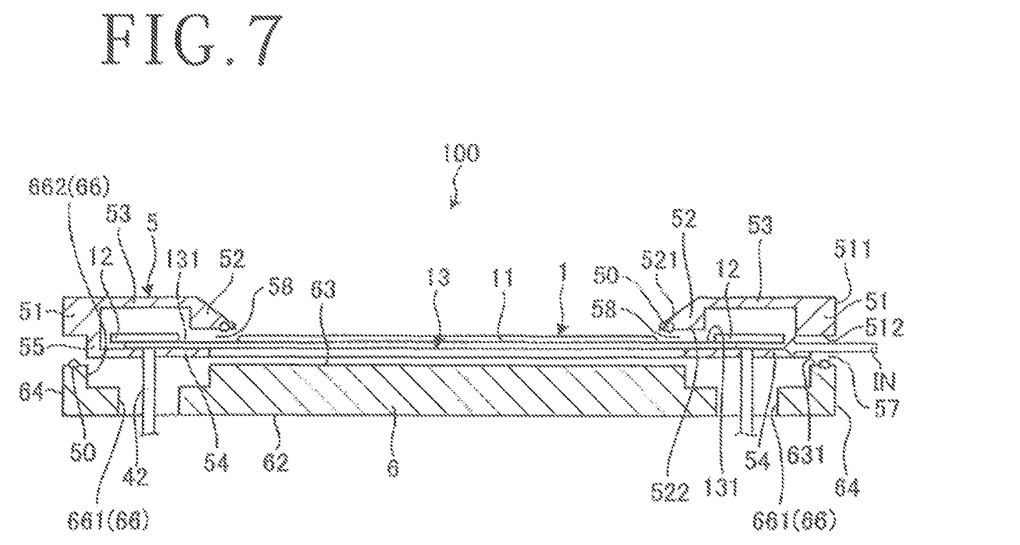
FIG. 7 is a sectional view of a state in which the frame unit has been carried in over the electrostatic chuck table depicted in FIG. 6 and in the cover member.
Figure 8:
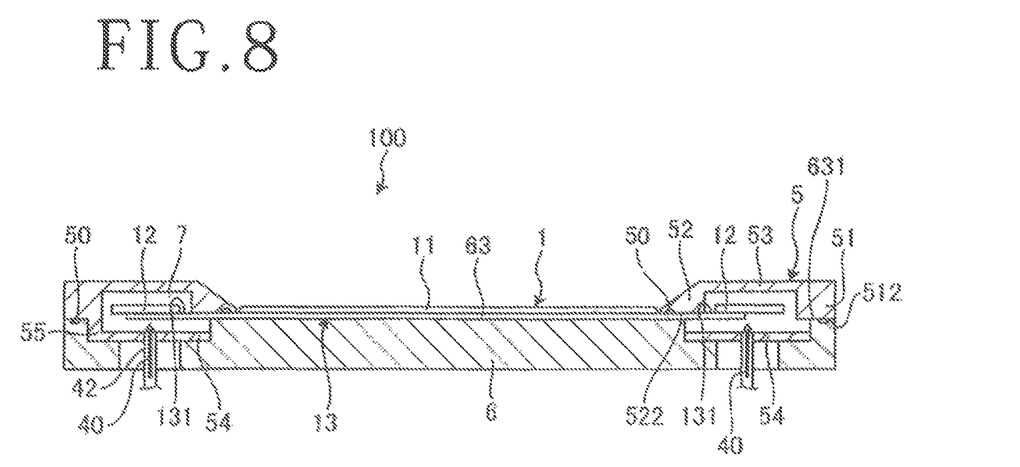
FIG. 8 is a sectional view depicting the electrostatic chuck table and the cover member in a frame unit holding step and a shielding step in the processing method of the wafer according to the embodiment.

FIG. 5 is a sectional view depicting a plasma etching apparatus used in a dry etching step of executing plasma etching for the wafer in the processing method of the wafer according to the embodiment. FIG. 6 is a perspective view of an electrostatic chuck table and a cover member in an etching chamber depicted in FIG. 5. FIG. 7 is a sectional view of a state in which the frame unit has been carried in over the electrostatic chuck table depicted in FIG. 6 and in the cover member. FIG. 8 is a sectional view depicting the electrostatic chuck table and the cover member in the frame unit holding step and the shielding step in the processing method of the wafer according to the embodiment.

The frame unit holding step ST4 is a step of attracting and holding the wafer 11 of the frame unit 1 by an electrostatic chuck table 6 (chuck table) in a plasma etching apparatus 4 depicted in FIG. 5 with the intermediary of the adhesion tape 13. Furthermore, the shielding step ST5 is a step of covering the annular frame 12 and/or an annular region 131 of the adhesion tape 13 exposed between the annular frame 12 and the wafer 11 by a cover member 5 to shield the annular frame 12 and/or the annular region 131 from the external space. The annular region 131 of the adhesion tape 13 is a ring-shaped region exposed between the annular frame 12 and the wafer 11 in parts of the adhesion tape 13 as depicted in FIG. 5 to FIG. 8.

As depicted in FIG. 5, the plasma etching apparatus 4 includes an etching chamber 41 and the electrostatic chuck table 6 (chuck table). A plasma treatment room 411 is disposed inside the etching chamber 41. The etching chamber 41 includes a bottom wall 412, an upper wall 413, a sidewall 414, and a gas supply pipe 43. The gas supply pipe 43 is disposed in the upper wall 413. In the etching chamber 41, the gas 45 (depicted by an arrow in FIG. 5 and in FIG. 9) in a plasma state is supplied into the plasma treatment room 411 through the gas supply pipe 43. An opening 415 is made in the sidewall 414. A gate 44 moves up and down by an actuator that is not depicted in the diagram. The opening 415 is allowed to be opened and closed by the upward-downward movement of the gate 44. An exhaust path that is not depicted in the diagram is connected to the etching chamber 41 and the internal atmosphere is exhausted.

The electrostatic chuck table 6 has a circular disc shape and attracts and holds the wafer 11 by an electrostatic attraction force with the intermediary of the adhesion tape 13. As depicted in FIG. 7, the electrostatic chuck table 6 includes a bottom surface 62, an upper surface 63, and a side surface 64. The upper surface 63 is a holding surface by which the back surface of the adhesion tape 13 is held. A through-hole 66 that penetrates in the upward-downward direction (thickness direction) is made in the peripheral part of the electrostatic chuck table 6. The through-hole 66 is divided into a smaller-diameter part 661 on the lower side and a larger-diameter part 662 on the upper side. The larger-diameter part 662 is a recessed part recessed downward from the upper surface 63. A groove whose section has a circular arc shape is made across the whole circumference on the outer circumferential side of the upper surface 63 close to the through-hole 66 and an O-ring 50 is fitted into this groove. The O-ring 50 is formed of rubber or the like having elasticity.

Furthermore, as depicted in FIG. 5 to FIG. 9, in the plasma etching apparatus 4, the cover member 5 is disposed on the upper side of the electrostatic chuck table 6. As depicted in FIG. 7, the cover member 5 includes an outer circumferential wall part 51, an inner circumferential wall part 52, an upper wall part 53, a bottom wall part 54, and a coupling part 55. The outer circumferential wall part 51 and the inner circumferential wall part 52 have a circular cylindrical shape that extends along the circumferential direction. The outer circumferential wall part 51 is formed into a circular cylindrical shape with an inner diameter larger than the outer diameter of the annular frame 12. An outer circumferential surface 511 of the outer circumferential wall part 51 has the same position in the radial direction of the electrostatic chuck table 6 as the side surface 64 of the electrostatic chuck table 6. A bottom surface 512 of the outer circumferential wall part 51 can abut against an outer edge part 631 of the upper surface 63.

The inner circumferential wall part 52 is formed into a circular cylindrical shape that has an inner diameter larger than the outer diameter of the wafer 11 and has an outer diameter smaller than the inner diameter of the annular frame 12. An inner circumferential surface 521 of the inner circumferential wall part 52 is formed as an inclined surface in which a position closer to the inner circumferential side is located closer to the lower side. A groove whose section has a circular arc shape is made across the whole circumference in a bottom surface 522 and the O-ring 50 is fitted into this groove. The O-ring 50 is formed of rubber or the like having elasticity. The bottom surface 522 can abut against the front surface of the adhesion tape 13. Specifically, the bottom surface 522 abuts against the part between the wafer 11 and the annular frame 12 in the front surface of the adhesion tape 13. The upper wall part 53 is formed into a ring shape and couples the upper end of the outer circumferential wall part 51 and the upper end of the inner circumferential wall part 52. The bottom wall part 54 is formed into a ring shape with an inner diameter smaller than the inner diameter of the annular frame 12, and the outer edge part thereof and the outer circumferential wall part 51 are monolithically coupled through the coupling part 55 as depicted on the left side in FIG. 7 except for the end part of the outer circumferential wall part 51 on the right side in FIG. 6. On the other hand, the bottom wall part 54 depicted at the end part on the right side in FIG. 7 is not coupled with the end part of the outer circumferential wall part 51 on the right side in FIG. 7. Therefore, an outer-circumferential-side opening 57 is opened between the outer circumferential wall part 51 and the bottom wall part 54. The outer-circumferential-side opening 57 is formed in such a manner that the frame unit 1 can be carried in and out to and from the cover member 5 as depicted by an arrow IN in FIG. 7. Furthermore, the width of the bottom wall part 54 in the radial direction is equal to the width of the larger-diameter part 662 of the through-hole 66. Moreover, an inner-circumferential-side opening 58 is made between the bottom surface 522 and the bottom wall part 54.

Furthermore, support pipes 42 that extend in the upward-downward direction are fixed to the lower side of the bottom wall part 54. The inside of the support pipe 42 is hollow and an inert gas 40 flows and passes through the inside. The inert gas 40 is a helium gas, for example. Moreover, the upper end of the support pipe 42 is monolithic with the bottom wall part 54 and therefore functions also as a support body when the cover member 5 is moved up and down. Specifically, by an actuator that is not depicted in the diagram, the cover member 5 can be moved up and down through the support pipes 42.

In the frame unit holding step ST4, as depicted in FIG. 7, in the state in which the cover member 5 has been raised relative to the electrostatic chuck table 6 and the outer-circumferential-side opening 57 is opened, the frame unit 1 is inserted through the outer-circumferential-side opening 57. Along with this, the annular frame 12 and the annular region 131 (see FIG. 5 and FIG. 7) of the adhesion tape 13 are disposed in the region surrounded by the outer circumferential wall part 51, the inner circumferential wall part 52, and the upper wall part 53 of the cover member 5.

In the frame unit holding step ST4 and the shielding step ST5, as depicted in FIG. 8, the support pipes 42 and the cover member 5 are lowered and the bottom wall part 54 of the cover member 5 is fitted into the larger-diameter part 662. Along with this, the outer edge part 631 of the upper surface 63 abuts against the bottom surface 512 of the outer circumferential wall part 51 and the bottom surface 522 of the inner circumferential wall part 52 abuts against the adhesion tape 13. In addition, the O-ring 50 is elastically deformed to exert a seal function.

Furthermore, in the frame unit holding step ST4, when the cover member 5 lowers and the bottom wall part 54 is fitted into the larger-diameter part 662, which is a recessed part, the wafer 11 is placed over the upper surface 63 of the electrostatic chuck table 6 with the intermediary of the adhesion tape 13. In the frame unit holding step ST4, power to generate an electrostatic attraction force is supplied to the electrostatic chuck table 6 and the wafer 11 is attracted and held over the upper surface 63 with the intermediary of the adhesion tape 13.

In the state in which the bottom wall part 54 of the cover member 5 is fitted into the larger-diameter part 662, a sealed space 7 is made by the cover member 5 and the electrostatic chuck table 6. Here, inside the sealed space 7, the annular frame 12 and the annular region 131 of the adhesion tape 13 are housed. As above, in the shielding step ST5, the annular frame 12 and the annular region 131 of the adhesion tape 13 can be shielded from the external space by being covered by the cover member 5. By causing the inert gas 40 to flow from the support pipes 42 into the inside of the sealed space 7, the pressure of the inside of the sealed space 7 can be set to a positive pressure.

Subsequently, a holding jig 100 of the frame unit will be described by using FIG. 5 to FIG. 7. The holding jig 100 of the frame unit is a jig that holds the frame unit 1 in which the wafer 11 is fixed in the opening of the annular frame 12 by the adhesion tape 13 in the etching chamber 41 of the plasma etching apparatus 4. The holding jig 100 includes the electrostatic chuck table 6 (chuck table), the cover member 5, the sealed space 7, the inner-circumferential-side opening 58, and the outer-circumferential-side opening 57. The electrostatic chuck table 6 attracts and holds the wafer 11. The cover member 5 is a circular annular member disposed movably in such a direction as to get closer to the electrostatic chuck table 6 (downward direction in FIG. 5 to FIG. 7) and in such a direction as to get further away from the electrostatic chuck table 6 (upward direction in FIG. 5 to FIG. 7). The sealed space 7 is a space that is to house the annular frame 12 of the frame unit 1 therein and is sealed from the external in the state in which the electrostatic chuck table 6 and the cover member 5 are close to each other. The inner-circumferential-side opening 58 is disposed on the inner circumferential side of the cover member 5. When the inner-circumferential-side opening 58 is opened, the annular frame 12 is allowed to freely be carried in and out to and from the sealed space 7.

Furthermore, the inner-circumferential-side opening 58 and the outer-circumferential-side opening 57 are closed when the cover member 5 and the electrostatic chuck table 6 get close to each other. Moreover, the cover member 5 includes the bottom surface 522 of the inner circumferential wall part 52. The bottom surface 522 forms the sealed space 7 when abutting against the adhesion tape 13. The annular region 131 of the adhesion tape 13 is housed inside the sealed space 7.

(Dry Etching Step ST6)

Figure 9:
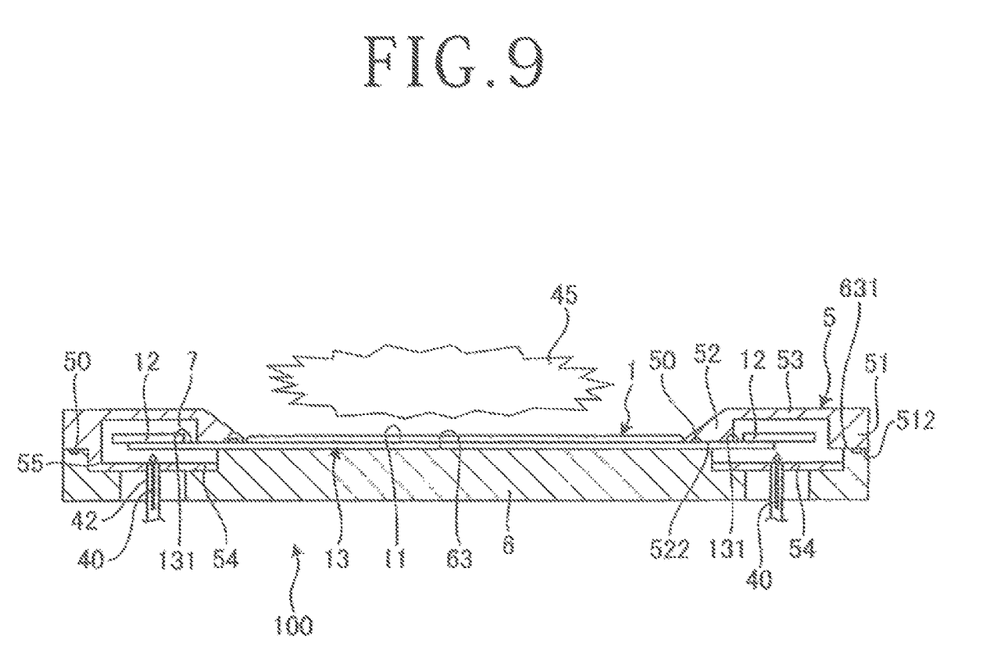
FIG. 9 is a sectional view depicting the electrostatic chuck table and the cover member in the dry etching step in the processing method of the wafer according to the embodiment.

FIG. 9 is a sectional view depicting the electrostatic chuck table and the cover member in the dry etching step in the processing method of the wafer according to the embodiment. The dry etching step ST6 is a step of supplying the gas 45 to the etching chamber 41 and executing dry etching for the wafer 11 after the execution of the frame unit holding step ST4 and the shielding step ST5. In the dry etching step ST6, while the annular frame 12 and the annular region 131 of the adhesion tape 13 are covered by the cover member 5 in the shielding step ST5, the gas 45 in the plasma state is caused to flow from the gas supply pipe 43 into the inside of the plasma treatment room 411 as depicted in FIG. 5. The dry etching is executed for the wafer 11 by the gas 45 in the plasma state. Here, because the annular frame 12 and the annular region 131 of the adhesion tape 13 are shielded by the cover member 5, the execution of the dry etching on the annular frame 12 and the annular region 131 of the adhesion tape 13 is suppressed. In the dry etching, plasma etching and gas etching in which a material is exposed in a reaction gas are included, for example. Furthermore, the purpose of the dry etching in the embodiment is to improve a flexural strength by removing debris and a heat-affected layer (damaged layer) generated in the laser processing in the planned dividing line processing step ST3. However, the present invention is not limited thereto and it is possible to apply dry etching also to processing of splitting the wafer 11 into rectangular chips along the planned dividing lines 14.

In the embodiment, an etching apparatus of what is generally called a remote plasma system is used in which the gas 45 in the plasma state in the external of the etching chamber 41 is introduced into the inside of the etching chamber 41 through the gas supply pipe 43. However, in the present invention, an etching apparatus of what is generally called a direct plasma system may be used in which an etching gas before being turned to plasma is supplied from upper electrodes to the inside of the etching chamber 41 and high-frequency power is applied to each electrode to turn the etching gas to plasma inside the etching chamber 41.

The processing method of a wafer according to the embodiment described above includes the frame unit preparation step of fixing the wafer 11 in the opening of the annular frame 12 by the adhesion tape 13 to prepare the frame unit 1 and the frame unit holding step of attracting and holding the wafer 11 of the frame unit 1 by the electrostatic chuck table 6 (chuck table) in the etching chamber 41 with the intermediary of the adhesion tape 13. The processing method includes also the shielding step of covering the annular frame 12 and the annular region 131 of the adhesion tape 13 by the cover member 5 to shield the annular frame 12 and the annular region 131 from the external space and the dry etching step of supplying the gas 45 to the etching chamber 41 and executing dry etching for the wafer 11 after execution of the frame unit holding step and the shielding step.

As above, by covering the annular frame 12 and the annular region 131 of the adhesion tape 13 by the cover member 5 to shield them from the external air in the dry etching, an effect of suppression of alteration of the annular frame 12 and the annular region 131 of the adhesion tape 13 due to the dry etching and leaving of a residual of fluorine is achieved. For example, when fluorine (F) is left as a residual on the adhesion tape 13, possibly the fluorine corrodes electrodes of devices. However, this corrosion of electrodes of devices can be suppressed according to the present embodiment.

Furthermore, in the embodiment, the annular frame 12 is formed of a resin and the annular frame 12 is covered by the cover member 5 in the shielding step. Therefore, an effect of suppression of discoloration of the annular frame 12 due to the dry etching and dust generation is achieved.

Moreover, in the case of executing plasma etching as the dry etching step, an effect that the width set as the planned dividing line (street) 14 can be reduced and the number of devices of each wafer 11 can be increased and the processing time can be shortened is achieved.

In the embodiment, the form in which the shielding step ST5 is executed after the frame unit holding step ST4 is described. However, the frame unit holding step ST4 may be executed after the shielding step ST5. Moreover, the frame unit holding step ST4 and the shielding step ST5 may be simultaneously executed.

The present invention is not limited to the above-described embodiment. That is, the present invention can be carried out with various modifications without departing from the gist of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer, comprising:
   a frame unit preparation step of fixing the wafer in an opening of an annular frame by an adhesion tape to prepare a frame unit whereby an annular region of the adhesion tape lies between an outside circumference of the wafer and an inside circumference of the annular frame;

a frame unit holding step of attracting and holding the wafer of the frame unit by a chuck table in an etching chamber with intermediary of the adhesion tape;

a shielding step of covering the annular frame and at least a portion of the annular region of the adhesion tape by a cover to shield the annular frame and the portion of the annular region from an external space, wherein the cover comprises a bottom surface of an inner circumferential wall part and an-O-ring fitted into a groove in the bottom surface and the shielding step comprises abutting at least the O-ring against the annular region of the adhesion tape to thereby form a sealed space within which the annular frame resides; and a dry etching step of supplying a gas to the etching chamber and executing dry etching for the wafer after execution of the frame unit holding step and the shielding step wherein the gas is suppressed from entering the sealed space by the cover.

2. The processing method of a wafer according to claim 1, wherein
the dry etching step comprises supplying gas in a plasma state.

3. The processing method of a wafer according to claim 1 wherein the bottom surface of the inner circumferential wall part of the cover has a groove therein and wherein an O-ring resides in the groove and wherein the O-ring abuts the annular region of the adhesion tape when the bottom surface of the inner circumferential wall part is abutted against the annular region of the adhesion tape.

4. The processing method of a wafer according to claim 1, wherein
the annular frame is formed of a resin.

5. The processing method of a wafer according to claim 4, wherein
the dry etching step comprises supplying gas in a plasma state.

6. The processing method of a wafer according to claim 1 wherein a positive pressure is generated within the sealed space.

7. The processing method of a wafer according to claim 6 wherein the positive pressure is generated within the sealed space by delivering an inert gas into the sealed space.

8. The processing method of a wafer according to claim 1 wherein the chuck table has a circular shape.

9. The processing method of a wafer according to claim 8 wherein the chuck table is an electrostatic chuck table.

10. The processing method of a wafer according to claim 8 wherein the chuck table comprises a through-hole in a peripheral part of the chuck table and wherein
the cover comprises a bottom wall part and wherein the bottom wall part of the cover fits within a portion of the through-hole in the chuck table when the bottom surface of the inner circumferential wall part of the cover abuts against the annular region of the adhesion tape.

11. The processing method of a wafer according to claim 1 wherein the cover may be raised and lowered and wherein the bottom surface of the inner circumferential wall part is caused to abut against the annular region of the adhesion tape to thereby form a sealed space when the cover is lowered.

12. The processing method of a wafer according to claim 11 further comprising raising the cover after dry etching step wherein when the cover is raised the bottom surface of the inner circumferential wall part of the cover no longer abuts against the annular region of the adhesion tape and an inner gap is created between the bottom surface of the inner circumferential wall part of the cover and the annular region of the adhesion tape.

13. The processing method of a wafer according to claim 11 further comprising raising the cover after dry etching step;
wherein the cover comprises a bottom wall part and an outer circumferential wall part, wherein a portion of the outer circumferential wall part has an outer-circumferential-side opening therein separating a portion of the outer circumferential wall part from the bottom wall part of the cover; wherein the method further comprises:
removing the frame unit from being positioned under the cover by moving the frame unit through the outer-circumferential-side opening while the cover is raised.

14. The processing method of a wafer according to claim 13 wherein the outer-circumferential-side opening is closed when the cover is lowered and the inner circumferential wall part of the cover abuts against the annular region of the adhesion tape.

* * * * *